(12) United States Patent
Len et al.

(10) Patent No.: US 11,158,920 B2
(45) Date of Patent: Oct. 26, 2021

(54) HIGH POWERED RF PART FOR IMPROVED MANUFACTURABILITY

(71) Applicant: TTM TECHNOLOGIES INC., Santa Ana, CA (US)

(72) Inventors: Michael Len, Skaneateles, NY (US); Hans Peter Ostergaard, Viborg (DK)

(73) Assignee: TTM Technologies Inc., Santa Ana, CA (US)

( * ) Notice: Subject to any disclaimer, the term of this patent is extended or adjusted under 35 U.S.C. 154(b) by 0 days.

(21) Appl. No.: 15/486,361

(22) Filed: Apr. 13, 2017

(65) Prior Publication Data

US 2017/0309983 A1    Oct. 26, 2017

Related U.S. Application Data

(60) Provisional application No. 62/327,839, filed on Apr. 26, 2016, provisional application No. 62/338,281, filed on May 18, 2016.

(51) Int. Cl.
*H01P 1/30* (2006.01)
*H01P 5/18* (2006.01)
(Continued)

(52) U.S. Cl.
CPC .............. *H01P 1/30* (2013.01); *H01P 5/187* (2013.01); *H05K 1/0203* (2013.01);
(Continued)

(58) Field of Classification Search
CPC . H01P 1/30; H01P 3/02–026; H01P 3/08–088
(Continued)

(56) References Cited

U.S. PATENT DOCUMENTS 4,821,007 A * 4/1989 Fields ............... H01P 3/085
174/266
5,625,169 A 4/1997 Tanaka
(Continued)

FOREIGN PATENT DOCUMENTS

WO    02061875 A2    8/2002

OTHER PUBLICATIONS

International Search Report and Written Opinion Form PCT/ISA/220, International Application No. PCT/US2017/027298, pp. 1-14, International Filing Date Apr. 13, 2017, dated Jul. 19, 2017.

*Primary Examiner* — Dean O Takaoka
*Assistant Examiner* — Alan Wong
(74) *Attorney, Agent, or Firm* — Polsinelli PC

(57) ABSTRACT

An electrical component, such as an RF device or thermal bridge, for use with a printed circuit board. The component has a first dielectric layer having a top and a bottom, a first conductive trace positioned on the bottom of the dielectric layer, and a first ground layer positioned on the bottom of the dielectric layer and spaced apart from the first conductive trace. For RF applications, a second conductive trace is positioned on top of first dielectric, a second dielectric is positioned on top of the second conductive trace, and a second ground plane is positioned on top of the second dielectric. A printed circuit board having a third conductive trace may then be coupled to the first conductive trace by a first solder layer.

21 Claims, 13 Drawing Sheets

(51) Int. Cl.
  *H05K 1/02* (2006.01)
  *H05K 1/03* (2006.01)
  *H05K 3/34* (2006.01)

(52) U.S. Cl.
  CPC ......... *H05K 1/0243* (2013.01); *H05K 1/0204* (2013.01); *H05K 1/0215* (2013.01); *H05K 1/0251* (2013.01); *H05K 1/0306* (2013.01); *H05K 3/3431* (2013.01); *H05K 3/3442* (2013.01)

(58) Field of Classification Search
  USPC ........ 333/115, 116, 236, 238, 245, 246, 247
  See application file for complete search history.

(56) References Cited

U.S. PATENT DOCUMENTS

| | | | |
|---|---|---|---|
| 6,342,681 B1 * | 1/2002 | Goldberger | H01P 5/185 |
| | | | 174/261 |
| 7,109,830 B2 * | 9/2006 | Sweeney | H01P 5/185 |
| | | | 333/246 |
| 7,468,645 B2 * | 12/2008 | Yamaguchi | H01P 3/088 |
| | | | 333/238 |
| 7,671,709 B2 * | 3/2010 | Yagisawa | H05K 1/0219 |
| | | | 333/260 |
| 7,911,066 B2 * | 3/2011 | Ehlers | H01L 24/73 |
| | | | 257/778 |
| 8,063,715 B2 * | 11/2011 | Sasaki | H01P 5/187 |
| | | | 333/116 |
| 8,766,742 B2 * | 7/2014 | Torsiello | H01P 5/187 |
| | | | 333/109 |
| 8,912,634 B2 * | 12/2014 | Danny | H01P 5/107 |
| | | | 257/664 |
| 8,969,733 B1 | 3/2015 | Mei | |
| 8,975,987 B2 * | 3/2015 | Kinpara | H01P 3/081 |
| | | | 333/246 |
| 9,668,346 B2 * | 5/2017 | Shirao | H01P 3/081 |
| 10,849,219 B2 * | 11/2020 | Sikina | H01P 3/081 |
| 2004/0037062 A1 | 2/2004 | Sweeney | |
| 2004/0124943 A1 | 7/2004 | Roberson | |
| 2012/0242423 A1 | 9/2012 | Torsiello | |

* cited by examiner

HIGH POWERED RF PART FOR IMPROVED MANUFACTURABILITY

CROSS-REFERENCE TO RELATED APPLICATIONS

The present application claims priority to U.S. Provisional App. No. 62/327,839, filed on Apr. 26, 2016 and U.S. Provisional App. No. 62/338,281 filed on May 18, 2016.

BACKGROUND OF THE INVENTION

1. Field of the Invention

The present invention relates generally to electrical components and, more particularly, to a coupler having improved power handling for RF and thermal bridge applications.

2. Description of the Related Art

The power handling of a given RF device is limited by its heat dissipation capabilities. Examples of typical RF devices include microstrip transmission lines, stripline transmission lines, and broadside stripline couplers disposed on microstrip printed circuit boards. The heat dissipation characteristics of a given design depend on its configuration and the type of dielectric materials employed therein. If the thermal energy generated by an RF device is dissipated over a relatively small surface area, the heat will build up over time, become problematic and thus limit the power handling capabilities of the device.

The thermal energy conducted through a device or assembly can be described by the thermal resistance ($R_{th}$). Moreover, each element or component (e.g. conductor or dielectric layer) that the heat traverses or conducts through is characterized by a thermal resistance. The power handling of a given RF device is limited by its heat dissipation capabilities and the power handling of the assembly is a function of the thermal resistance ($R_{th}$), ambient or mounting temperature, a maximum operating temperature and the dissipated power (in the conductor):

$$\text{Dissipated power} = (P_{in})(1 - 10^{-(IL/10)}),$$

where $P_{in}$ is the input power [W] and IL is the insertion Loss [dB];

$$R_{th} = D/(k \ast A),$$

where k is the Thermal Conductivity [W/mK] of the material that the heat is passing through, D is the Distance [m] of heat flow, and A is the cross sectional area of the heat flow [m$^2$]. The maximum operating temperature is defined as the maximum temperature at which a material may be subjected to, that will not cause degradation of the material.

Thus, there is a need for an approach that can reduce the number of thermal resistance elements for a given assembly, thereby improving overall thermal performance and heat dissipation characteristics.

BRIEF SUMMARY OF THE INVENTION

The present invention provides a system that reduces the number of thermal resistance elements when coupled to a printed circuit board and thus provides for improved thermal performance. In a first embodiment, the invention comprises an electrical component having a first dielectric layer having a top and a bottom, a first conductive trace positioned on the bottom of the dielectric layer, and a first ground layer positioned on the bottom of the dielectric layer and spaced apart from the first conductive trace. A first ground plane may be positioned on the top of the first dielectric layer. A second ground layer may be positioned on the bottom of the first dielectric layer and spaced apart from the first conductive trace and the first ground layer. In this embodiment, the electrical component may be a thermal bridge where the first dielectric layer has a high thermal conductivity and is formed from a ceramic material such as AlN or Al$_2$O$_3$.

In another embodiment, the invention comprises an electrical component having a first dielectric layer having a top and a bottom, a first conductive trace positioned on the bottom of the dielectric layer, a first ground layer positioned on the bottom of the dielectric layer and spaced apart from the first conductive trace, a second conductive trace positioned on top of first dielectric, and a second dielectric positioned on top of the second conductive trace. A second ground plane may be positioned on top of the second dielectric. This structure may then be attached to a printed circuit board having a third conductive trace that is coupled to the first conductive trace by a first solder layer. The printed circuit board may include a second ground layer spaced apart from the third conductive trace and coupled to the first ground layer by a second solder layer. The printed circuit board may further include a third dielectric layer supporting the third conductive trace and a second ground plane positioned on an opposing side of the third dielectric layer. The printed circuit board may further include at least one interconnection via formed through the third dielectric layer. This embodiment may comprise a RF device where the third conductive trace comprises a transmission line and the first conductive trace is wider than the transmission line or the first conductive trace is narrower than the transmission line. A set of ground vias may be positioned on either side of the transmission line. The printed circuit board may further include signal contact regions coupled to device pads associated with the first conductive trace.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1:
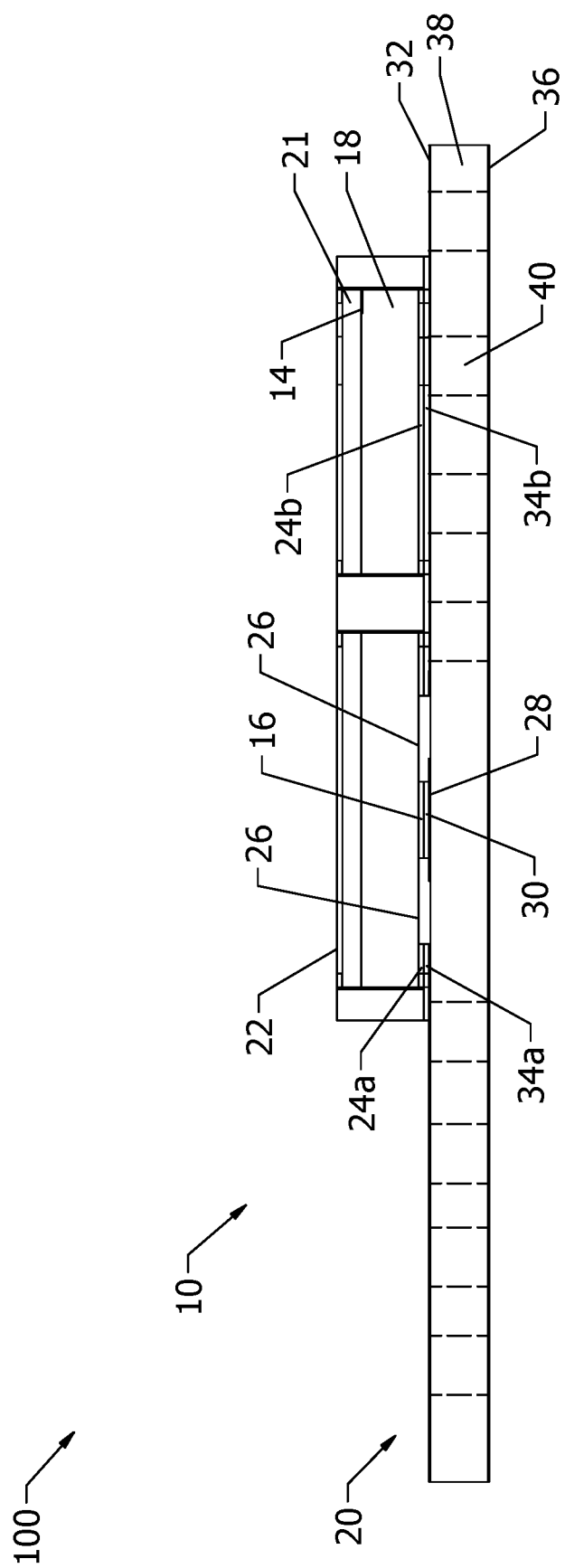
FIG. 1 is a cross-sectional view of a broadside coupled coupler assembly in accordance with an embodiment of the present invention.

Referring to the figures, wherein like numerals refer to like parts throughout, there is seen in FIG. 1 a cross-sectional view of a broadside coupled coupler assembly 100 having an electrical component 10 configured as a broadside coupler mounted to a printer circuit board (PCB) 20 according to the present invention. Coupler 10 is configured to be adapted to the form factor of PCB 20 to eliminate superfluous thermal resistance layers and improve the thermal dissipation properties and the power handling capabilities of assembly 100. Coupler 10 differs from conventional broadside couplers in that coupler 10 contains approximately "two-thirds" of the typical structure and is instead configured according to the present invention so that PCB 20 provides the remaining structure required to form a complete coupler.

Coupler 10 includes a top conductive trace 14 and a bottom conductive tract 16 disposed on either side of a dielectric layer 18. Another dielectric layer 21 is disposed over conductive trace 14. A ground plane 22 is disposed over dielectric layer 21. Bottom conductive trace 16 is isolated from a paid of ground layers 24a and 24b by dielectric regions 26 formed therebetween. Coupler 10 is mounted on PCB 20 so that bottom conductive trace 16 is electrically and mechanically coupled to a conductive trace 28 of PCB 20 by a solder layer 30. Bottom ground layers 24a and 24b of coupler 10 are coupled to an upper ground layer 32 of PCB 20 by corresponding layers of solder 34a and 34b. PCB 20 includes another ground layer 36 disposed on the side of a dielectric layer 38 from ground layer 32. PCB 20 may further include interconnection vias 40 formed in the interior of dielectric layer 38 to serve as ground vias or signal vias as needed.

Figure 2:
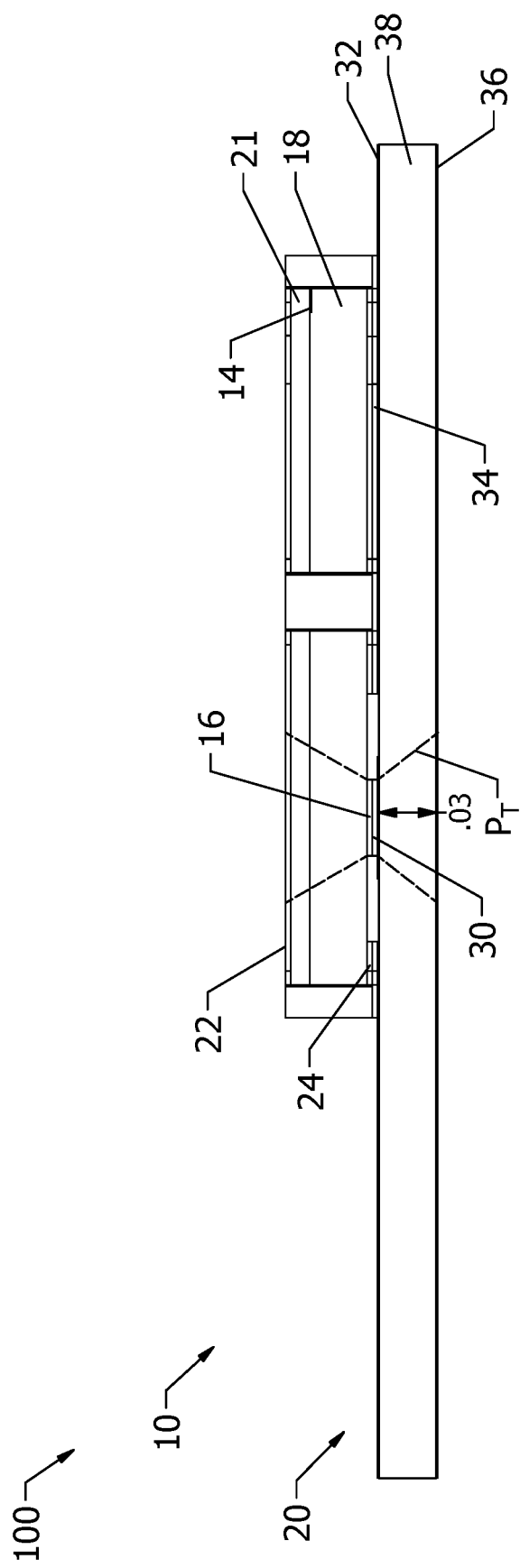
FIG. 2 is a diagrammatic depiction of the thermal dissipation path for the broadside coupler assembly depicted in FIG. 1

As seen in FIG. 2, the thermal dissipation path ($P_T$) for coupler assembly 100 of FIG. 1, extends upwardly through coupler 10 and downwardly through PCB 20. The thermal energy dissipated by a given device or assembly can be expressed as function of the thermal resistance ($R_{th}$), which is defined by the following equation;

$$R_{th}=D/(k*A),$$

where k is the Thermal Conductivity of the material that the heat is passing through, D is the Distance of heat flow, and A is the cross sectional area of the heat flow. Those skilled in the art will appreciate that the area (A) can be defined as the region under the PCB 20 and substantially within the thermal dissipation path ($P_T$). In other words, those skilled in the art will appreciate that the area does not necessarily correspond to the dashed line pattern of the thermal dissipation path ($P_T$).

Figure 3:
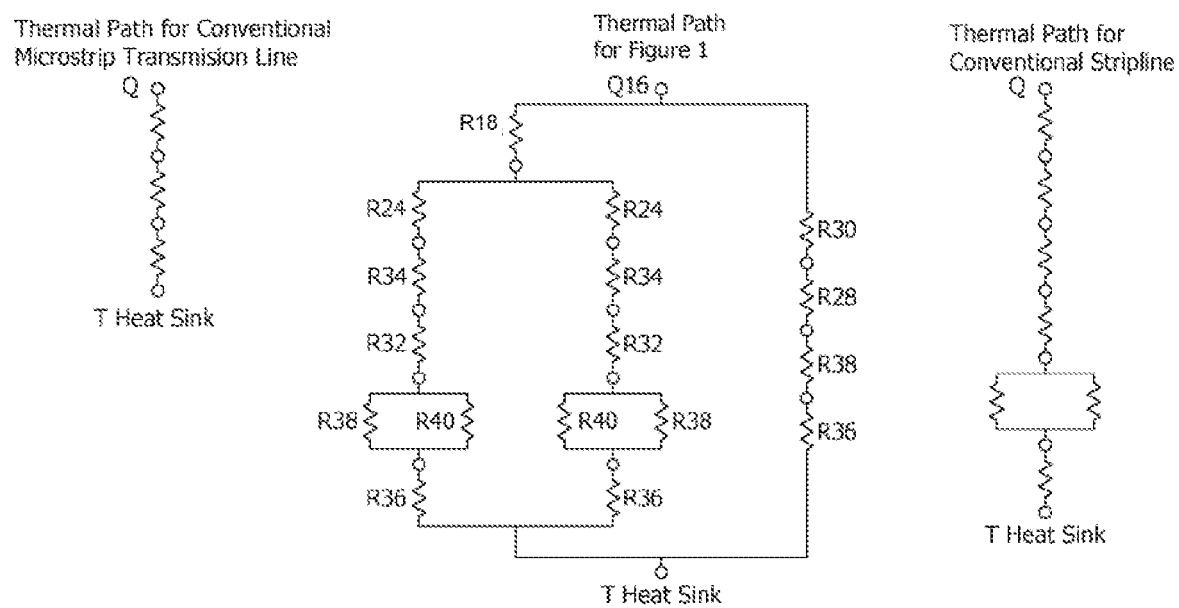
FIG. 3 is a chart comparing the thermal performance of the broadside coupler assembly of FIG. 1 of the present invention to conventional assemblies.

Referring to FIG. 3, the thermal path of broadside coupler assembly 100 of FIG. 1 begins with bottom conductive trace 16 and includes the thermal resistance of solder layer 30, the thermal resistance of PCB conductive trace 28, the thermal resistance of dielectric layer 38, and the thermal resistance of ground layer 36. The total thermal resistance of coupler assembly 100 is thus only nominally more than a conventional microstrip transmission line, which has the thermal resistance path also seen in FIG. 3, and significantly less than a conventional stripline component, also seen in FIG. 3. In addition, as further seen in FIG. 3, broadside coupler assembly 100 has an additional, complementary thermal path that only further brings the total thermal conductivity closer to that of a conventional microstrip transmission line and even more significantly less than a conventional stripline component. Because coupler 10 of the present invention is adapted to use the form factor of PCB 20, superfluous thermal resistance layers have been eliminated so that the thermal path for device 10 of the present invention is nearly identical to the thermal path for a microstrip transmission line and only one additional resistance component, i.e., solder 30. Thus, the present invention represents a significant improvement over a conventional stripline component.

The improvement of coupler 10 of the present invention relative to a conventional coupler depicted may be demonstrated using an analysis of standard operating values as follows:

Heat Sink Mounting Interface Temperature=Tmnt=95° C.;

Input Power=Pin=100 W;

Insertion Loss=IL=0.05 dB;

Conductor Width=0.025 in;

Conductor Length=0.200 in;

Dielectric Height=0.03 in;

Copper Thickness=0.002 in;

Solder Thickness=0.003 in;

Plated Through Hole Diameter=0.03 in; and

Dielectric Thermal Conductivity=1.25 W/m*K

Based on the above stated values, the calculations are as follows:

| Description | Dissipated Power (W) | Thermal Resistance (C./W) | Temperature Differential (C.) | Trace Temperature (C.) |
|---|---|---|---|---|
| Conventional coupler | 1.8 | 101 | 176 | 271 |
| Coupler 10 | 1.6 | 69 | 109 | 204 |
| Percent Improvement | | 31% | 38% | 25% |

Note that the Dissipated Power for the two components (10, 20) is different due to different Trace Temperatures. The values were calculated using the following expressions:

$$\text{Dissipated Power}=Q=Pin*(1-10^{-IL/10})$$

$$\text{Thermal Resistance}=R=D/(k*A)$$

$$\text{Temperature Differential}=dT=Q*R$$

$$\text{Trace Temperature}=T=dT+Tmnt$$

For this example calculation, there is a 30 percent or greater reduction in Thermal Resistance and Temperature Differential for assembly 100 of the present invention over a conventional stripline coupler assembly. For the same trace temperature, coupler 10 will have a 40 percent or greater power handling increase (from 100 W to 144 W) over a conventional assembly.

Figure 4:
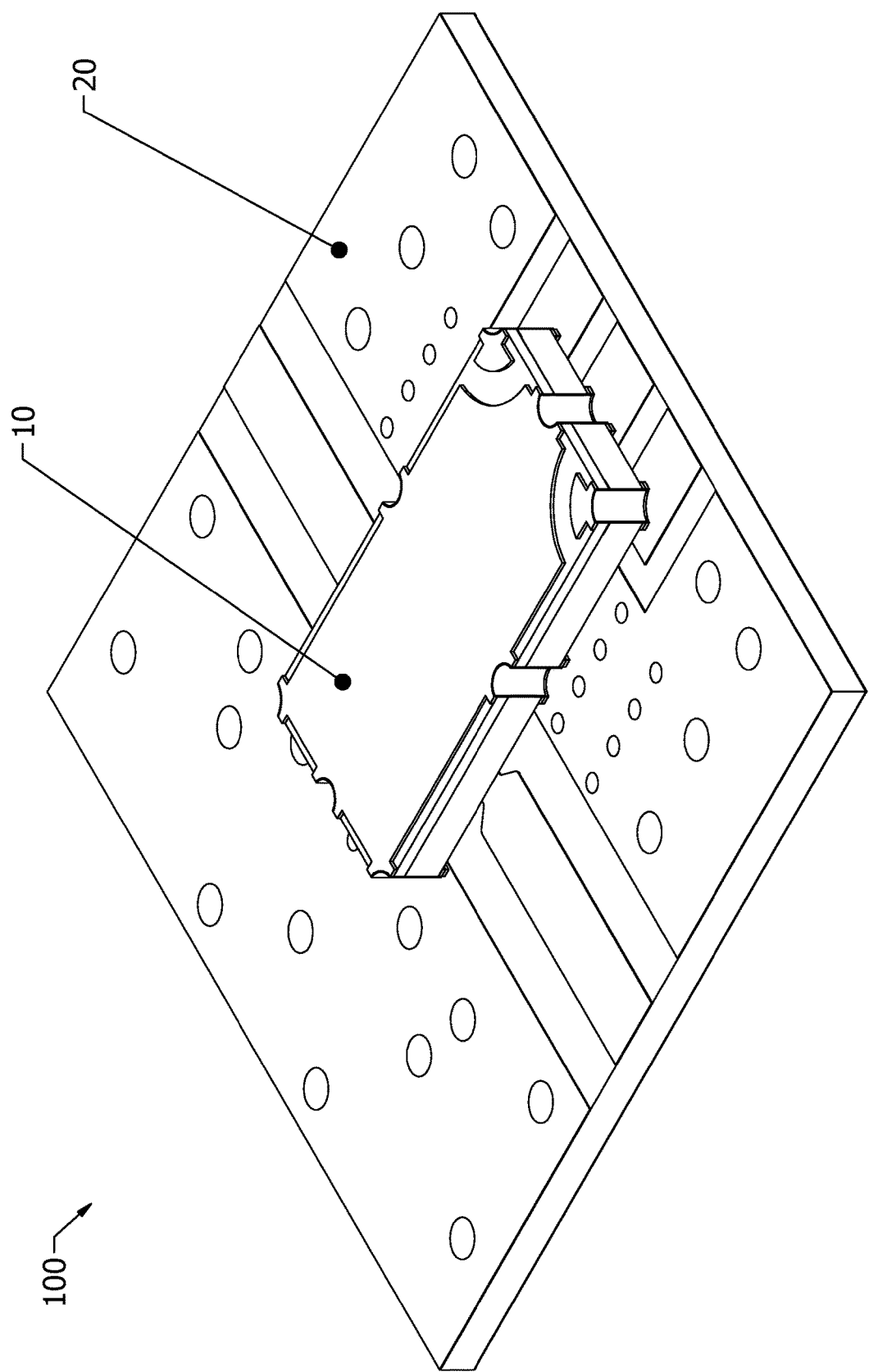
FIG. 4 is an isometric view of a broadside coupler assembly in accordance with the present invention.
Figure 5:
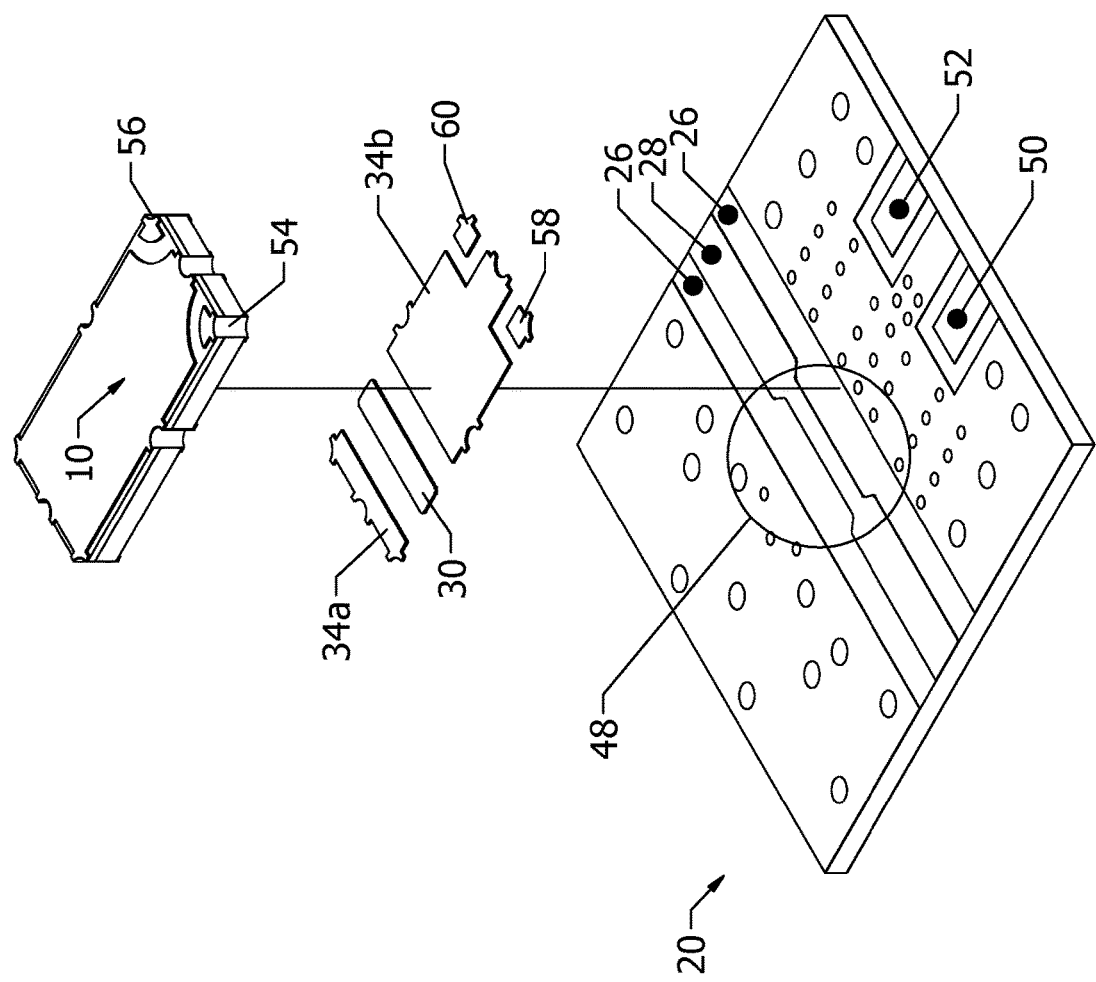
FIG. 5 is a top exploded view of the broadside coupler assembly in accordance with the present invention.

Coupler 10 of FIG. 1 may be used in connection with various applications. For example, as seen in FIG. 4, coupler 10 may be mounted on PCB 20 as described above to form an improved broadside coupled coupler assembly 100. Referring to FIG. 5, broadside coupler assembly 100 may be formed by disposing coupler 10 over the various requisite solder layers in order to provide the appropriate connections between related portions of coupler 10 and PCB 20. More specifically, ground layer 32 of PCB 20 has portions removed at predetermined regions to form dielectric regions 26 on either side of microstrip transmission line 28. A solder-connected region 48 provides connectivity with lower coupler trace 16 of coupler 10 via solder layer 30. PCB 20 also includes signal contact regions 50 and 52 that are connected to device pads 54 and 56 via solder pads 58 and 60, respectively. Solder layer 34 couple device ground layer 24 to ground layer 32 of PCB 20.

Figure 6:
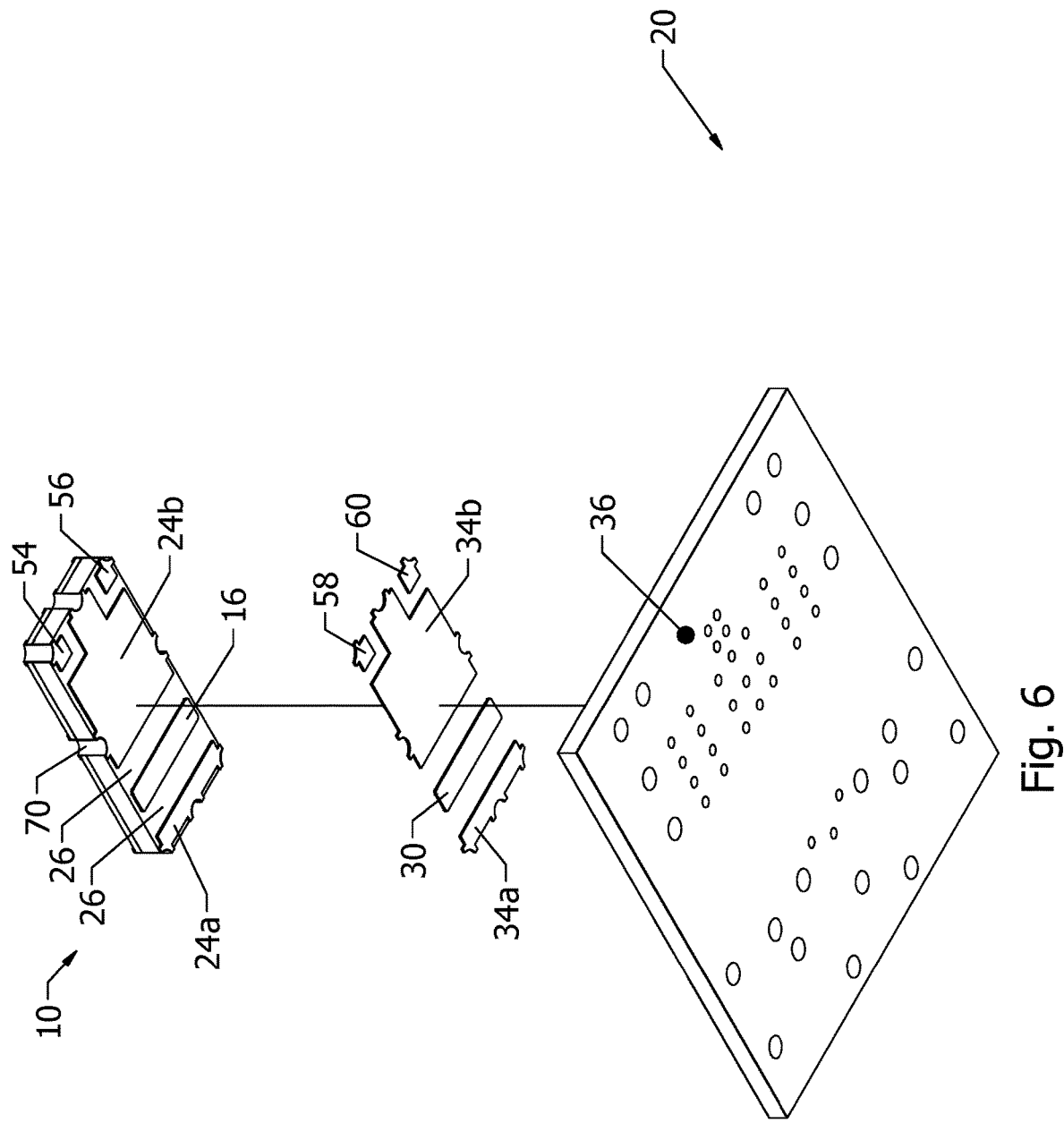
FIG. 6 is a bottom exploded view of the broadside coupler assembly in accordance with the present invention.

Referring to FIG. 6, solder layer 30 connects to bottom conductive trace 16 on the underside of coupler 10. Signal contact regions 50 and 52 (not visible in this view) are connected to device pads 54 and 56, respectively, via solder pads 58 and 60, respectively. Solder layers 34a and 34b correspond to device ground layers 24a and 24b, respectively. The lower device conductive trace 16 is connected to the microstrip transmission line 28 (not visible in this view) by solder layer 30.

Figure 7:
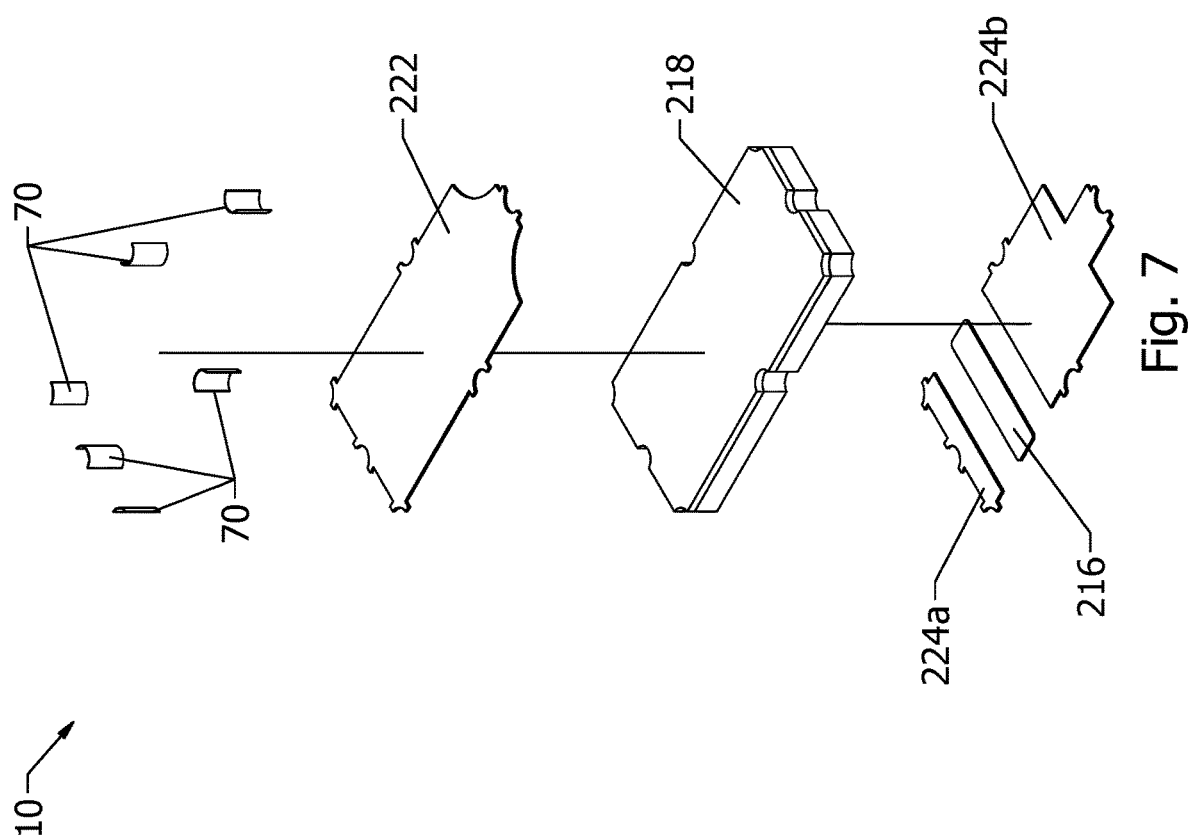
FIG. 7 is an exploded view of a transmission line assembly in accordance with an embodiment of the present invention.

Referring to FIG. 7, component 10 of the present invention may be configured a transmission line assembly 200 in accordance with the present invention comprises ground plane 222 disposed over dielectric core 218. A transmission line conductor 216 is disposed on the opposing side of core 218. Transmission line conductor 216 is isolated from ground layers 224a and 224b as described above with respect to coupler 10.

Figure 8:
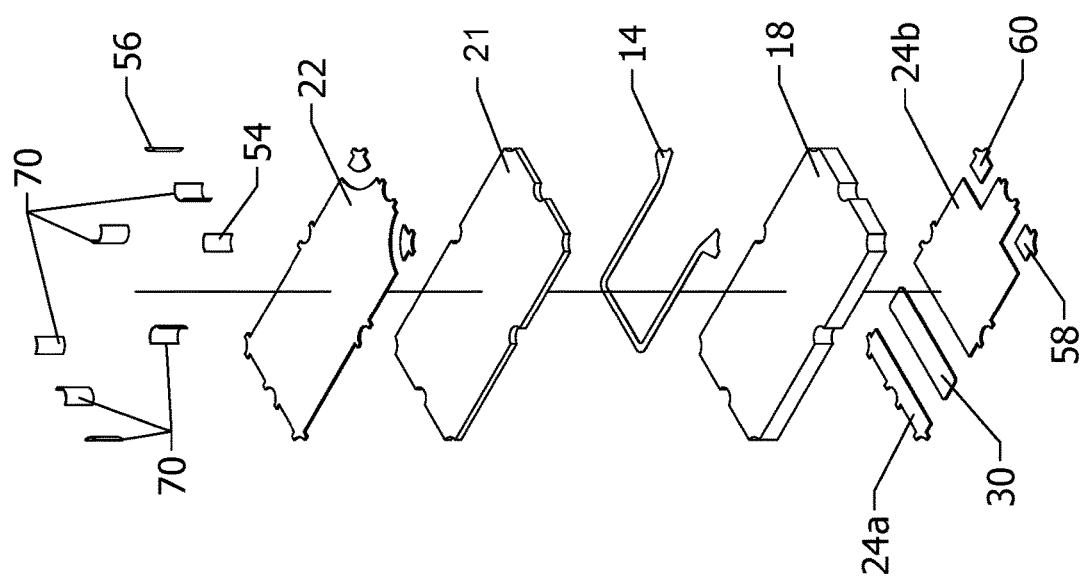
FIG. 8 is an exploded view of a broadside coupler in accordance with another embodiment of the present invention.

There is seen in FIG. 8 an exploded view of the broadside coupler 10. Trace 14 is disposed between dielectric layers 18 and 21. Dielectric layer 21 includes conductive ground plane 22 whereas conductive trace 16 is disposed on the underside (not shown in this view) of dielectric layer 18. The direct and coupled traces of coupler 10 may be etched on the opposite sides of the core dielectric layer 18 to achieve the best layer-to-layer registration as preferred for consistent coupling. Direct trace 14 of coupler 10 is wider than microstrip transmission line 28. Consequently, the coupling is a function of the layer-to-layer alignment of coupler 10 rather than the alignment of coupler 10 to microstrip transmission line 28. Coupler 10 further includes a set of ground vias (PTHs) 70 on either side of the microstrip transmission line that improves both thermal and RF performance.

Figure 9:
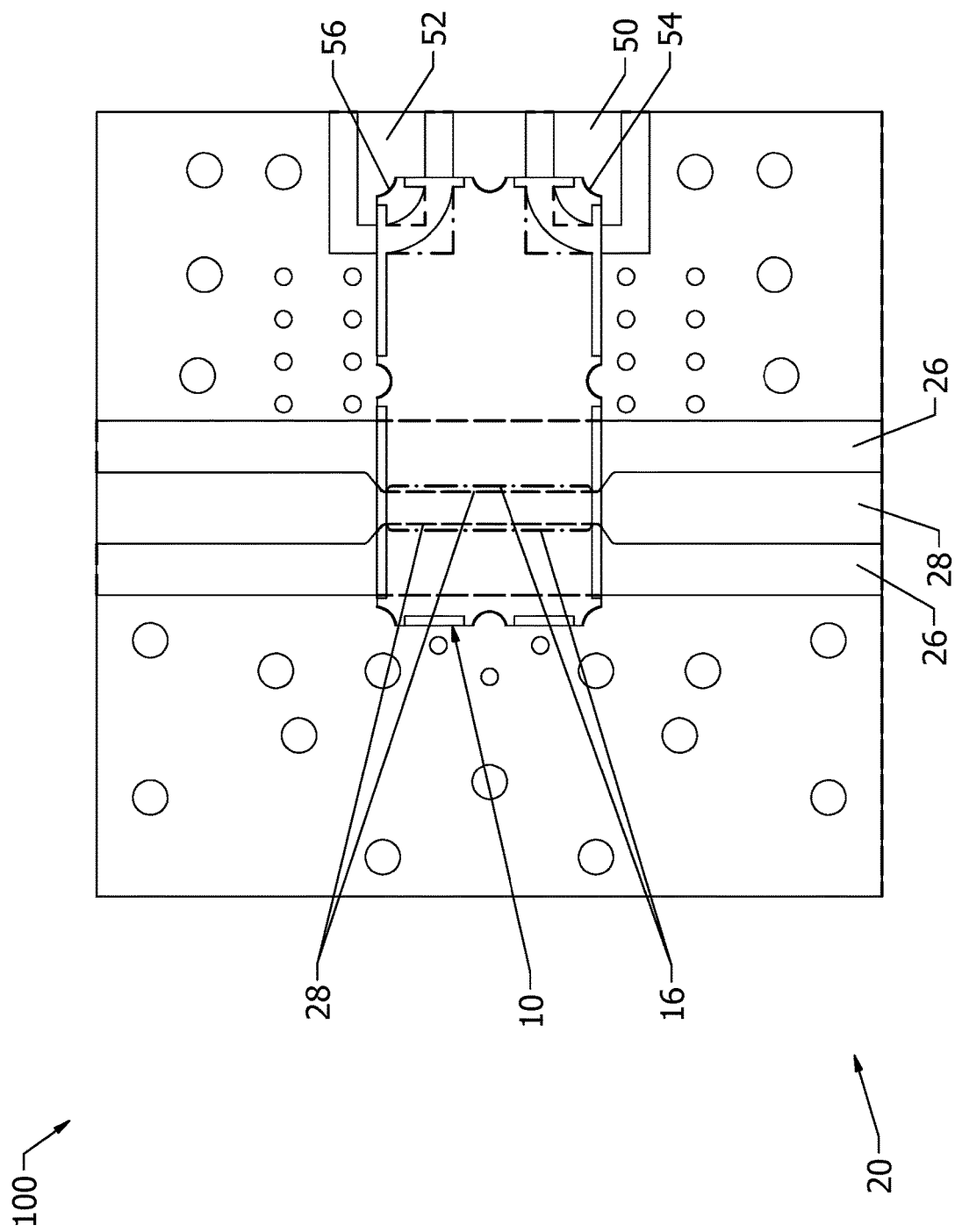
FIG. 9 is a plan view of a broadside coupler assembly in accordance with a further embodiment of the present invention.

Referring to FIG. 9, a plan view of the broadside coupler assembly 100 illustrates that direct trace 16 of coupler 10 is wider than the microstrip transmission line 28. This view also shows trace 14 coupled to the signal outputs formed by device pads 54 and 56 and thus signal contact regions 50 and 52.

Figure 10:
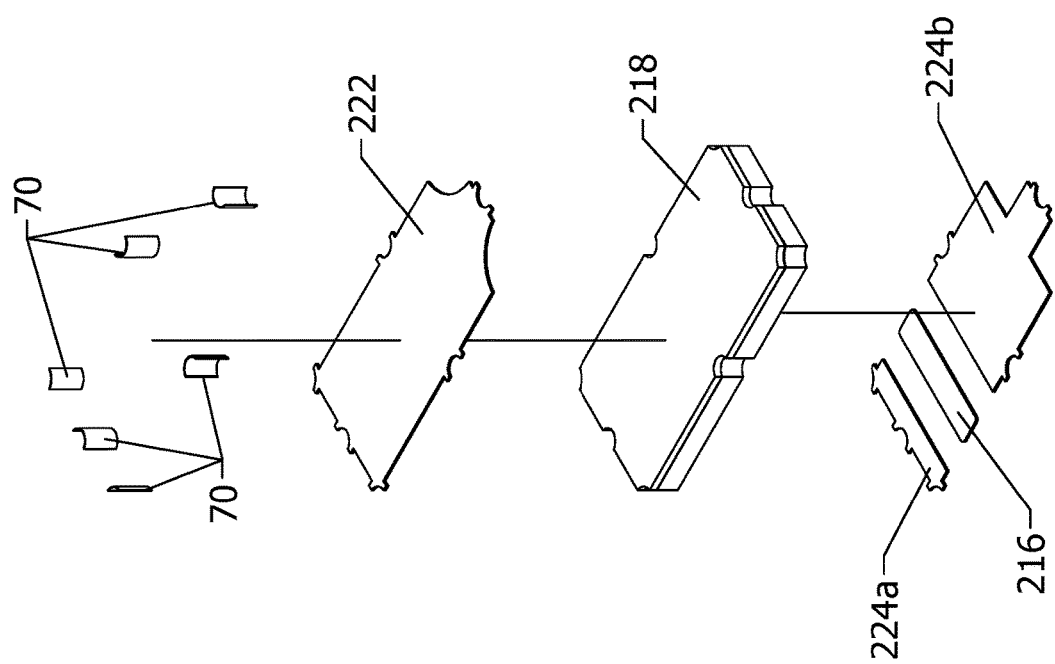
FIG. 10 is an exploded view of a thermal bridge in accordance with another embodiment of the present invention.
Figure 11:
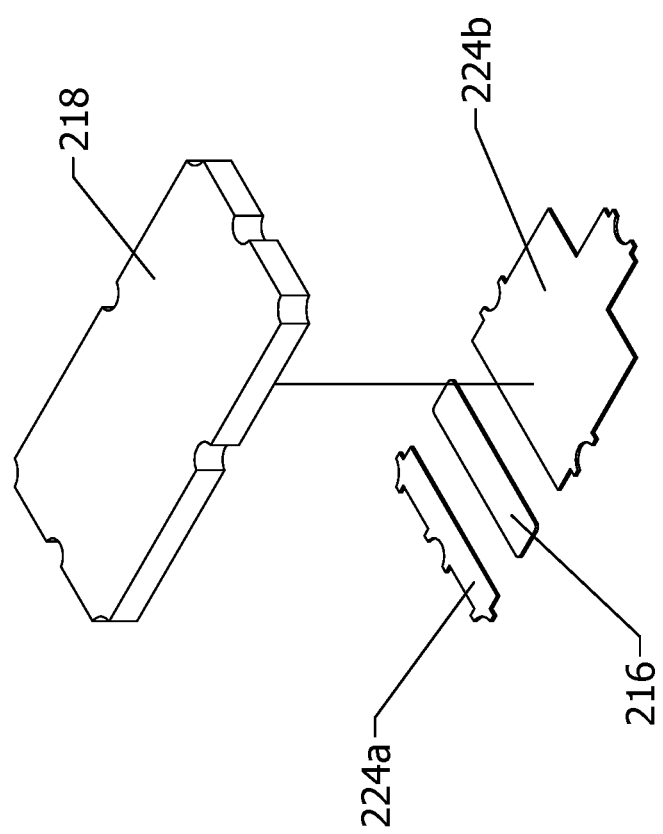
FIG. 11 is an exploded view of a thermal bridge in accordance with a further embodiment of the present invention.
Figure 12:
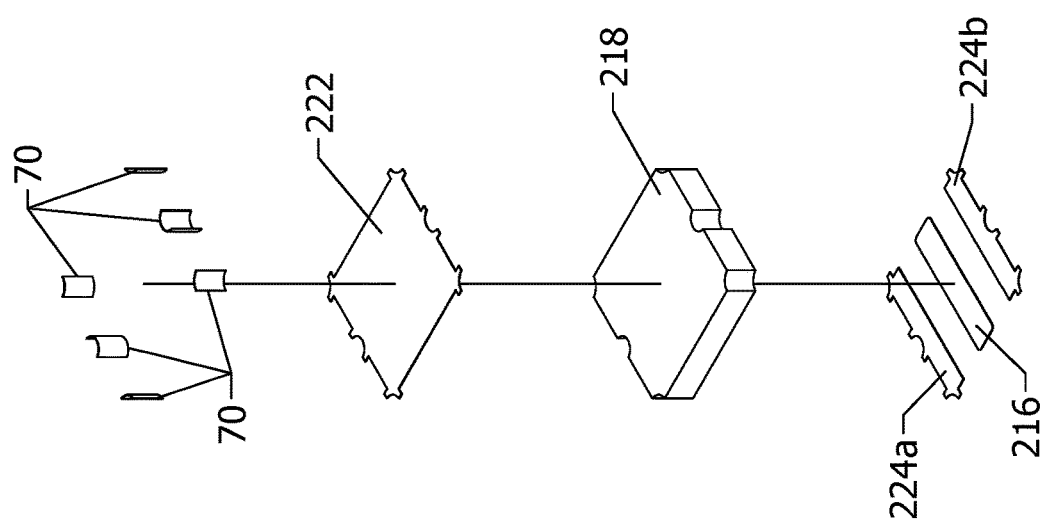
FIG. 12 is an exploded view of a thermal bridge in accordance with an embodiment of the invention.
Figure 13:
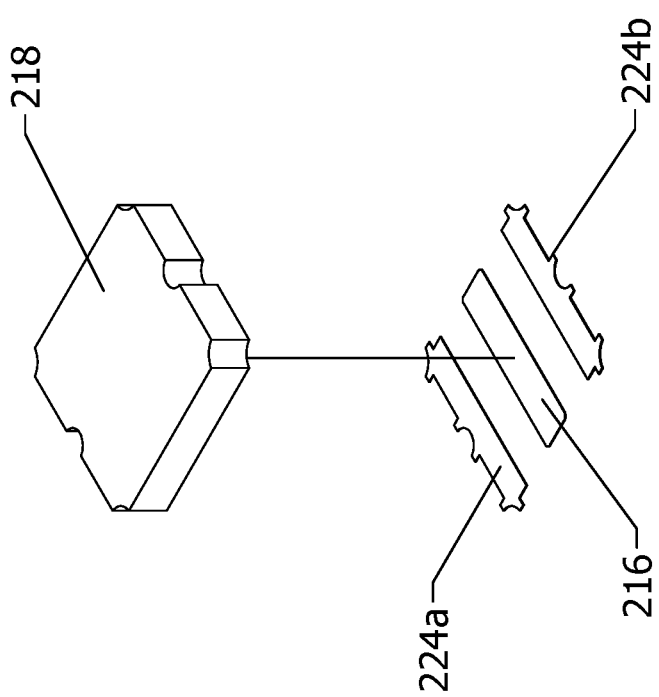
FIG. 13 is an exploded view of a thermal bridge in accordance with an embodiment of the invention.

Referring to FIG. 10, component 10 of the present invention may be configured for use as a thermal bridge with transmission line conductor 216 being wider than any microstrip transmission line 28 and dielectric core 218 comprising a material having high thermal conductivity, such as a ceramic (AlN or $Al_2O_3$). Referring to FIG. 11, ground plane 222 disposed over dielectric core 218 may be omitted for this implementation, leaving dielectric core 218 as the uppermost surface. Referring to FIGS. 12 and 13, component 10 may be dimensioned for use as a thermal bridge by reducing the overall length as compared to other embodiments of the invention.

What is claimed is:

1. An electrical component for a printed circuit board, comprising:
a first dielectric layer having a top and a bottom;
a first conductive trace positioned on the bottom of the first dielectric layer;
a first ground layer positioned on the bottom of the first dielectric layer and spaced apart from the first conductive trace, wherein the first conductive trace is aligned with a second conductive trace of the printed circuit board along a full length of the first conductive trace;
a first solder layer connecting the first conductive trace to the second conductive trace of the printed circuit board and extending the full length of the first conductive trace, wherein the second conductive trace comprises a transmission line and is a portion of the electrical component;
a second solder layer connecting the first ground layer to an upper ground layer of the printed circuit board;
a third conductive trace over the top of the first dielectric layer, wherein the first conductive trace and the third conductive trace are wider than the transmission line; and
wherein the upper ground layer is spaced apart from the second conductive trace on top of the printed circuit board, wherein the electrical component has a thermal path comprising the first solder layer.

2. The component of claim 1, further comprising a first ground plane positioned on the top of the first dielectric layer and including at least one via spanning the first dielectric layer.

3. The component of claim 2, further comprising a second ground layer positioned on the bottom of the first dielectric layer and spaced apart from the first conductive trace and the first ground layer.

4. The component of claim 3, wherein the first dielectric layer has a high thermal conductivity.

5. The component of claim 1, wherein the first dielectric layer is formed from a ceramic material.

6. The component of claim 5, wherein the ceramic material is selected from the group consisting of AlN and $Al_2O_3$.

7. The component of claim 6, wherein the ceramic material is a thermal bridge.

8. The component of claim 1, wherein the thermal path further comprises the first conductive trace, the second conductive trace of the printed circuit board, and the first dielectric layer.

9. The component of claim 1, further comprising a second dielectric layer over the third conductive trace.

10. The component of claim 1, wherein the third conductive trace is connected to a plurality of device pads, and the first solder layer does not connect to the plurality of device pads.

11. The component of claim 10, wherein the third conductive trace is coupled to signal outputs formed by the plurality of device pads coupled to a corresponding plurality of contact regions of the printed circuit board via the second solder layer.

12. An electrical component for a printed circuit board, comprising:
a first dielectric layer having a top and a bottom;

a first conductive trace positioned on the bottom of the first dielectric layer;

a first ground layer positioned on the bottom of the first dielectric layer and spaced apart from the first conductive trace, wherein the first conductive trace is aligned with a second conductive trace of the printed circuit board along a full length of the first conductive trace;

a third conductive trace positioned on the top of the first dielectric layer;

a second dielectric layer positioned on top of the third conductive trace;

a first solder layer connecting the first conductive trace to the second conductive trace of the printed circuit board and extending the full length of the first conductive trace, wherein the second conductive trace comprises a transmission line and is a portion of the electrical component, wherein the first conductive trace and the third conductive trace are wider than the transmission line; and a second solder layer connecting the first ground layer to a second ground layer spaced apart from the second conductive trace, wherein the second ground layer and the second conductive trace are on top of the printed circuit board, wherein the electrical component has a thermal path comprising the first solder layer.

13. The component of claim 12, further comprising a second ground plane positioned on top of the second dielectric layer and including at least one via spanning the second dielectric layer.

14. The component of claim 13, wherein the printed circuit board further includes a third dielectric layer supporting a third conductive trace and a second ground plane positioned on an opposing side of the third dielectric layer.

15. The component of claim 14, wherein the printed circuit board further includes at least one interconnection via formed through the third dielectric layer.

16. The component of claim 12, further comprising a set of ground vias positioned on either side of the transmission line.

17. The component of claim 16, wherein the printed circuit board further includes a plurality of signal contact regions.

18. The component of claim 17, wherein the plurality of signal contact regions is coupled to a corresponding plurality of device pads associated with the first conductive trace, wherein the first solder layer does not connect to the plurality of device pads.

19. The component of claim 18, wherein the component is an RF device.

20. The component of claim 14, wherein the thermal path further comprises the first conductive trace, the second conductive trace of the printed circuit board, and the first dielectric layer.

21. The component of claim 18, wherein the third conductive trace is coupled to signal outputs formed by the plurality of signal contact regions of the printed circuit board coupled to the corresponding plurality of device pads via the second solder layer.

* * * * *